April 11, 1961 W. F. PALMER ET AL 2,979,664
AMPLIFIER CIRCUIT
Filed Sept. 2, 1958
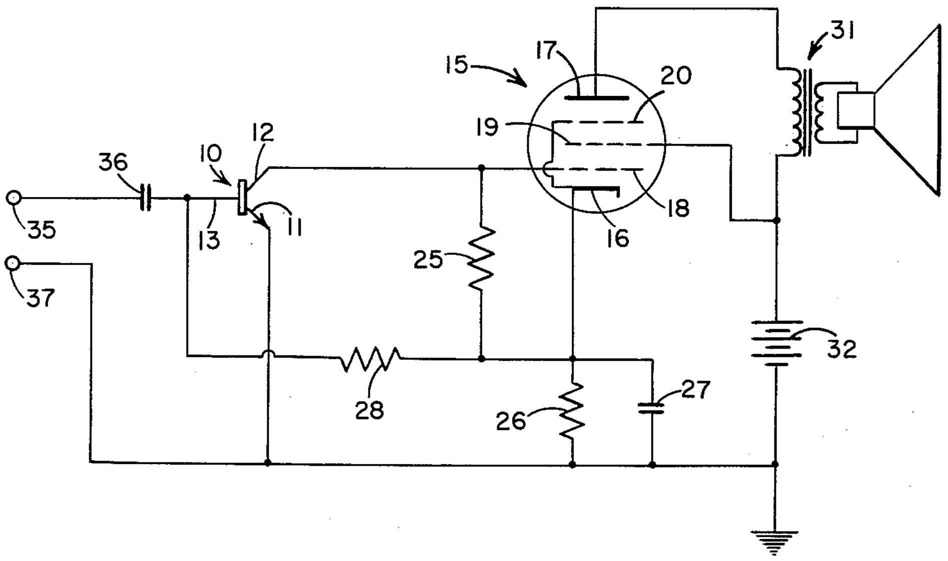
INVENTORS.
WILLIAM F. PALMER
GEORGE SCHIESS
BY
Elmer J. Nealon
ATTORNEY.

United States Patent Office 2,979,664

Patented Apr. 11, 1961

2,979,664

AMPLIFIER CIRCUIT

William F. Palmer, Carlisle, and George Schiess, Watertown, Mass., assignors, by mesne assignments, to Sylvania Electric Products Inc., Wilmington, Del., a corporation of Delaware Filed Sept. 2, 1958, Ser. No. 758,339

4 Claims. (Cl. 330—3)

This invention relates to electronic amplifier circuits, and particularly to amplifiers having a transistor stage coupled to a vacuum tube stage.

The use of transistors in amplifying circuits has found wide acceptance in electronic apparatus where space and power requirements are important considerations. Furthermore, in applications where only a single power supply is required to operate both transistors and tubes, it has often been found economically feasible to combine both in the same circuit. Certain of these so-called "hybrid" circuits are especially useful when low voltage power supplies are readily available, for example in automobile radio receivers. However, in electrical apparatus, such as, for example, television receivers, requiring high voltage power supplies for the operation of certain elements, the use of transistors in the circuitry has not been deemed economically feasible. Vacuum tube utilize the high voltage power supply available, while the combination of transistors and tubes would require additional components in the power supply and other portions of the circuit to provide the low voltage for transistor operation with no commercially attractive advantages.

It is an object of the present invention, therefore, to provide an amplifier having a vacuum tube stage and a transistor stage and requiring a minimum number of components.

A common problem in transistor circuits is the phenomenon of "thermal runaway." As the temperature of the transistor increases the current through the collector tends to increase. Increased current flow further raises the temperature of the transistor. The interactions of current and temperature thus are cumulative and uncontrolled multiplication of the current can occur. Various compensating elements and circuits are known and widely used to stabilize transistor operation despite temperature variations. The addition of components for this purpose, however, further increases the cost of transistor circuits.

Therefore, it is another object of the invention to provide an amplifier of simple design having a vacuum tube stage and a transistor stage which exhibits stability of operation with variations in temperature.

Briefly, in accordance with the objects of the invention, a two stage transistor-tube amplifier having the output of the transistor coupled to the input of the tube is provided wherein the biasing potential on the cathode of the tube is employed as a source of operating potential for the transistor. The voltage drop across an impedance connected between the collector and cathode provides the grid-to-cathode bias, and the resultant of this voltage drop and the potential drop across a cathode biasing resistor is the collector-to-emitter bias. Base current flow through a feedback resistor connected between the cathode and base establishes the bias potential on the base. Thus, all necessary operating potentials for the transistor are obtained from the bias potential on the cathode. Negative feedback voltage developed across the cathode biasing resistor provides stabilization of the circuit despite variations in temperature and characteristics of the tube and transistor employed.

The amplifier of the invention and its mode of operation together with additional objects, features, and advantages thereof may be more fully understood from the following discussion and the accompanying drawing. The single figure of the drawing is a schematic diagram of the circuit of a two stage transistor-tube amplifier according to the invention.

An NPN transistor 10 having an emitter electrode 11, a collector electrode 12, and a base electrode 13 is shown in the drawing. A pentode vacuum tube 15 having a cathode 16, an anode 17, a control grid 18, a suppressor grid 19, and a screen grid 20 internally connected to the cathode is also shown. The collector of the transistor is connected directly to the control grid of the tube. The collector and control grid also are connected to the cathode through a transistor load resistor 25. The cathode is connected to ground through a cathode biasing resistor 26. An A.C. by-pass condenser 27 is also connected between the cathode and ground. The base of the transistor is connected to the cathode through a feedback resistor 28, and the emitter of the transistor is grounded. The anode of the tube is connected through a load impedance comprising a speaker 31 to the positive terminal of a battery 32 which serves as a D.C. power source. The suppressor grid is connected directly to the positive terminal of the battery. Input signals are applied between the input terminal 35, which is connected to the base of the transistor through a coupling condenser 36, and the input terminal 37 which is grounded.

Under quiescent conditions of no applied input signal, D.C. flow in the anode-cathode circuit of the tube causes a potential drop across the cathode biasing resistor 26 thus biasing the cathode above ground potential. A potential which is positive with respect to the grounded emitter is thereby applied to the collector of the transistor. Current flow in the transistor collector circuit causes a voltage drop across the load resistor 25 thus biasing the grid and collector at a positive potential below that on the cathode. The base of the transistor is biased below the collector and above the emitter by the voltage drop caused by the base current flow through the feedback resistor 28.

With bias on the transistor and tube electrodes established as above, the amplifier circuit operates according to known transistor and vacuum tube phenomena. When a positive going input signal is applied to the base of the transistor via the input terminal 35, the base current through the transistor increases. Collector current through the transistor is thereby increased. This current flows through the transistor load resistor 25, and the resulting voltage drop across the resistor lowers the potential at the control grid of the tube. Current flow through the anode circuit of the tube is thereby reduced, and the voltage across the load impedance 31 is decreased thus driving the speaker.

When the input signal is negative going, the actions are reversed. The base current through the transistor is reduced thereby decreasing the collector current. Reduced current flow lessens the voltage drop across the transistor load resistor 25 and raises the potential on the control grid of the tube. Current flow in the anode circuit of the tube is thereby increased thus increasing the voltage across the load impedance 31 and driving the speaker.

The circuit arrangement shown and described above also exhibits thermal stability. As the temperature of a transistor increases the collector current tends to increase. This phenomenon is cumulative and, unless compensated for, leads to uncontrollable increase of collector current, or "thermal runaway." The circuit of the invention provides the necessary compensation through negative feedback to both the tube and the transistor. As the collector current through the transistor increases, the voltage drop across the transistor load resistor 25 increases and lowers the potential on the control grid of the tube. Current flow in the anode-cathode circuit of the tube is thus decreased thereby reducing the voltage drop across the cathode biasing resistor 26. Since the potentials on both the grid and the cathode are lowered, the net effect of the decreased grid potential in the tube stage is less than it would be without the negative feedback. In the transistor stage the lower potential on the cathode decreases the voltage drop and consequently the current flow in the base-emitter circuit. Reduction of the base current decreases the collector current in the transistor. Stabilization of the amplifier circuit is thus obtained through negative feedback effecting the base current of the transistor and the grid-to-cathode voltage of the tube.

In order that those familiar with the art may better understand the amplifier of the invention, the following typical circuit and its operation are described below with reference again to the figure of the drawing.

A Sylvania type 2N35 NPN germanium transistor is employed in combination with a 6AQ5 pentode vacuum tube. The D.C. source 32 provides 250 volts. The speaker 31 presents a load impedance of 5,000 ohms. The values of the resistors employed are 2,700 ohms for the transistor load resistor 25, 470 ohms for the cathode biasing resistor 26, and 680,000 ohms for the feedback resistor 28. The values of the capacitors are 25 microfarads for the A.C. by-pass condenser 27 and 10 microfarads for the input coupling condenser 36.

With the above components in the circuit of the figure, under quiescent conditions a positive potential of about 25 volts exists at the cathode. The voltage drop across the transistor load resistor 25 is about 12 to 13 volts. The grid is thus about 12 to 13 volts negative with respect to the cathode, and the collector is about 12 to 13 volts positive with respect to the emitter. The necessary operating potentials are thus supplied to the electrodes of the tube and the transistor.

The amplifier of the foregoing arrangement was operated with an input signal of 30 to 40 millivolts applied to the input terminals. A power gain of about 60 decibels was obtained with a power output of 1 watt. The amplifier has been operated to provide power output of up to 4 watts with less than 10% distortion.

What is claimed is:

1. A two stage amplifier including in combination an NPN transistor having an emitter, a collector, and a base, a vacuum tube having an anode, a cathode, and a control grid, said collector being connected directly to said control grid, said anode being connected to ground through a load impedance and a D.C. potential source, said cathode being connected to ground through a cathode biasing resistor, said emitter being directly connected to ground, a transistor load resistor connecting said collector and said grid to said cathode for providing operating potential at said collector and biasing potential on said grid, a feedback resistor connecting said base to said cathode for establishing biasing potential on said base, and input terminals for applying input signals to said base.

2. An amplifier circuit including in combination a transistor having an emitter, a collector, and a base, said transistor being of the type requiring a positive reverse bias on the collector with respect to the emitter in order to provide amplification at the collector of signals applied to the base, a vacuum tube having an anode, a cathode and a control grid, direct current coupling means connecting said collector to said control grid, said anode being connected to ground through a load impedance means and a D.C. potential source, cathode biasing means connecting said cathode to ground, coupling means connecting said emitter to ground, resistance means connecting said cathode to said collector, said collector being reverse biased by the voltage across said resistance means and said cathode biasing means, direct current coupling means connecting said base to said cathode for establishing biasing potential on said base, and input terminals for applying input signals to said base.

3. An amplifier circuit including in combination a transistor having an emitter, a collector, and a base, said transistor being of the type requiring a positive reverse bias on the collector with respect to the emitter in order to provide amplification at the collector of signals applied to the base, a vacuum tube having an anode, a cathode, and a control grid, direct current coupling means connecting said collector to said control grid, said anode being connected to ground through a load impedance means and a direct current potential source, said cathode being connected to ground through a cathode biasing resistor, said emitter being directly connected to ground, a resistor connecting said cathode to said collector, said collector being reverse biased by the voltage across said resistor and said cathode biasing resistor, feed-back means connecting said base to said cathode for establishing biasing potential on said base, and input terminals for applying input signals to said base.

4. A two-stage amplifier circuit including in combination an NPN transistor having an emitter, a collector, and a base, a vacuum tube having an anode, a cathode, and a control grid, direct current coupling means connecting said collector to said control grid, said anode being connected to ground through a load impedance and a direct current potential source, said cathode being connected to ground through a cathode biasing resistor in parallel with an A.C. by-pass condenser, said emitter being directly connected to ground, a resistor connecting said cathode to said collector for producing operating potential at said collector and biasing potential on said grid, a feedback resistor connecting said base to said cathode for establishing biasing potential on said base, and input terminals for applying input signals to said base.

References Cited in the file of this patent

UNITED STATES PATENTS

| | | |
|---|---|---|
| 2,032,193 | White | Feb. 25, 1936 |
| 2,698,416 | Sherr | Dec. 28, 1954 |
| 2,835,795 | Kroger | May 20, 1958 |
| 2,864,888 | Goodrich | Dec. 16, 1958 |

FOREIGN PATENTS

| | | |
|---|---|---|
| 150,232 | Australia | Feb. 23, 1953 |
| 751,112 | Great Britain | June 1956 |

OTHER REFERENCES

Sziklai: "Transistor Circuits and Applications," Electronic Engineering, September 1953, pages 358–360.